United States Patent [19]

Malmquist

[11] Patent Number: 4,803,306

[45] Date of Patent: Feb. 7, 1989

[54] ELECTROMAGNETIC SHIELDING CLIP

[75] Inventor: Richard G. Malmquist, Winchester, Mass.

[73] Assignee: Computervision Corporation, Bedford, Mass.

[21] Appl. No.: 57,610

[22] Filed: Jun. 3, 1987

[51] Int. Cl.⁴ .............................................. H05K 9/00
[52] U.S. Cl. .................................................. 174/35 GC
[58] Field of Search ..................... 174/35 GC, 65 R; 24/23 R, 33 B, 295, 129 B, 265 A

[56] References Cited

U.S. PATENT DOCUMENTS

| | | |
|---|---|---|
| 2,245,375 | 6/1941 | Wiley .................................. 24/295 |
| 2,540,790 | 2/1951 | Kost .................................... 24/295 |
| 3,277,230 | 3/1965 | Stickney et al. . | 
| 3,504,095 | 1/1968 | Roberson et al. . |
| 3,594,490 | 7/1971 | Mitchell . |
| 3,885,084 | 5/1975 | Kaiserswerth et al. . |
| 4,554,400 | 11/1985 | Schmalzl . |

FOREIGN PATENT DOCUMENTS 338592 7/1959 Switzerland .......................... 24/295

*Primary Examiner*—Stanley J. Witkowski
*Assistant Examiner*—David A. Tone
*Attorney, Agent, or Firm*—Robert M. Asher

[57] ABSTRACT

An electromagnetic shielding clip made from a metallic strip having a U-shaped attaching portion with a notch formed on each side of the attaching portion. The metallic strip has a bent portion at the top of each side of the U-shaped attaching portion. A contact wing extends from at least one of the bent portions. The clip engages a conductive panel between the bent portion and the top ledge formed by the notch.

28 Claims, 2 Drawing Sheets

ELECTROMAGNETIC SHIELDING CLIP

BACKGROUND OF THE INVENTION

The present invention is directed to electromagnetic shielding. To meet FCC and other regulatory agency EMI (electromagnetic interference) compliance requirements it is necessary to control propagation of EMI from a product with appropriate shielding. The ideal shield would be a continuous conductive metal box around the source field. It is desirable, however, to break this shield to provide slots for cooling and removable panels for assembly, test, and service. Breaking the continuity of the shield with an elongated opening reduces its effectiveness.

The allowable length of the elongated opening is dependent upon the frequency of the source field. To maintain shielding effectiveness as the source frequency increases, the allowable slot length becomes shorter. While a ground strap from a chassis to a conductive panel may provide adequate shielding effectiveness for one product, there are other products which require periodic contact between the conductive panels and the chassis.

In a volume product, the requirement of repeatable periodic contact between the conductive metal chassis and removable conductive panels must be met in a cost-effective manner. Fasteners are reliable but labor-intensive. Adhesive-backed contact devices are labor-intensive, difficult to locate repeatedly and unreliable. Devices that slip onto an edge have limited application and seem to slip off as easily as on.

U.S. Pat. No. 4,554,400 (Schmalzl) discloses a metal clip that has a nose portion and two end tabs. The nose portion fits into a slot in a conductive plane and holes are provided on either side of the slot for inserting the tabs to hold the clip in place. The nose portion may also be bent to assist in holding the clip in its position.

It is an object of the present invention to provide an electromagnetic shielding clip that can be easily inserted and securely held within a single slot in a conductive panel.

SUMMARY OF THE INVENTION

The electromagnetic shielding clip of the present invention is a metallic strip having an attaching portion formed in a U-shape with two sides and a bottom. In each of the two sides a notch is formed which provides a substantially non-deformable ledge and tapers from the ledge back into the side of the strip towards the bottom. A bent portion is provided at the end of each side of the attaching portion. The attaching portion can be snapped into a slot in a conductive panel and is held in place between the bent portions and the ledges of the notches. A contact wing extends from at least one of the bent portions to provide an electromagnetic contact with a second conductive panel.

According to a feature of the invention, the notches in the sides of the attaching portion have an exposed edge pointing away from the bottom of the attaching portion. The edge can be used to oppose the bent portion of the clip and reliably hold a conductive panel between the bent portion and the notch. Also, according to this feature of the invention, the exposed edge can be used to dig into a plastic panel to secure the clip in place.

The notches used in the present invention advantageously retain their ledge so that the clip will not fall out of its slot.

Other objects and advantages of the invention will become apparent during the following description of the presently preferred embodiment of the invention taken in conjunction with the drawings.

DETAILED DESCRIPTION OF THE PREFERRED EMBODIMENTS

Figure 1:
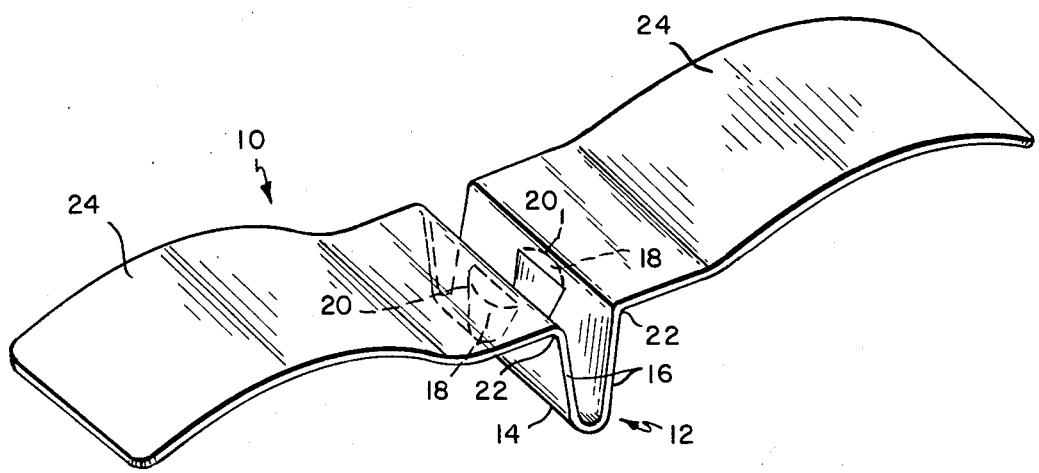
FIG. 1 is a perspective view of the electromagnetic shielding clip of the present invention.
Figure 2:
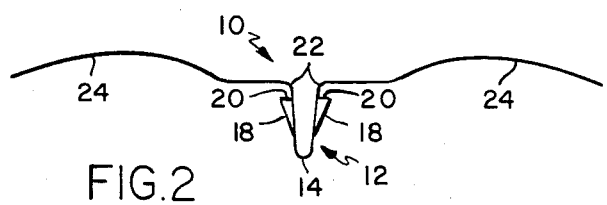
FIG. 2 is an elevational view of the clip of FIG. 1.

Referring now to FIGS. 1 and 2, an electromagnetic shielding clip 10 of the present invention is shown. Clip 10 is a conductive metallic strip that can be heat-treated to spring temper. The center of the strip is formed into a deep slender U-shape. The U-shaped portion is the attaching portion 12 of the clip. The attaching portion 12 has a bottom 14 and two sides 16.

A notch 20 is punched in each side 16 of the attaching portion 12. The notch 18 has an upper edge 20. The edge 20 forms a ledge out from the side 16. The ledge is angled with respect to the side 16 so as to be capable of securely restraining the clip 10 in place once inserted onto a panel. A perpendicular ledge is preferred. The edge 20 is arc shaped and surrounds a hole through the metal metallic strip. The metallic strip tapers from the edge 20 back into the side 16 in the direction towards the bottom.

The ledge is substantially non-deformable which means that in ordinary use it will not fold so as to allow the clip to fall out. This is a significant advantage of providing a notch to form the ledge rather than merely making a bend in the metallic strip. A bend may lose its shape permitting such a clip to become dislodged.

At the top of the U-shaped attaching portion 12 there are bent portions 22 at the tops of each of the sides 16. Adjacent to the bent portions 22 is shown a contact wing 24 in the shape of a leaf spring.

Figure 3:
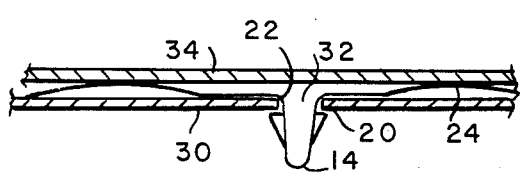
FIG. 3 is an elevational view of the clip of FIG. 1 in use between two parallel plates shown in cross-section.

Referring now to FIG. 3, an electromagnetic clip 10 is shown locked in place in a slot 32 in a conductive panel 30. The clip 10 can easily be snapped into place by pressing the U-shaped attaching portion 12 into the slot 10 until the ledges 20 on the notches 18 engage the underside of the panel 30. The taper of the notches 18 make it easier to slide the attaching portion into the slot. The ledge formed by the edge 20 in the notch 18 is spaced from the bent portion 22 so that the conductive panel 30 will be held snugly between the ledge and the bent portion. The contact wings 24 are hump-shaped. Thus, a parallel panel 34 may be pressed against the humped contact wing 24 to make electrical contact.

Figure 4:
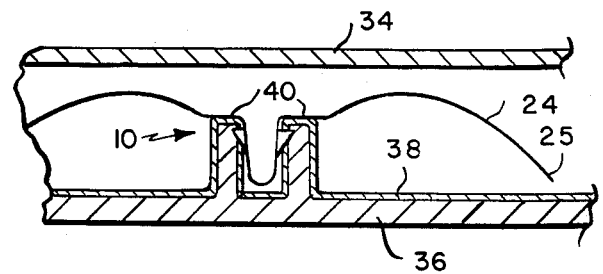
FIG. 4 is an elevational view of an electromagnetic shielding clip of the present invention inserted into a plastic panel shown in cross-section.

Referring to FIG. 4, the electromagnetic shielding clip 10 of the present invention may also be advantageously used with a plastic panel 36. In using a plastic panel 36, it is possible to provide two projecting ribs 40 for receiving the clip rather than putting a hole in the panel to provide a slot. The projecting ribs 40 create a valley into which the shielding clip 10 may be inserted. Electromagnetic shielding is provided by the plastic panel by coating the panel with a conductive coating 38. The shielding clip 10 is held within the valley between the projecting ribs 40 by the edges 20 of the of the notches 18 which dig into the plastic wall. In the embodiment shown in FIG. 4, it is preferable for the humped contact wing 24 to have an increased taper down to its tip 25 so that when a parallel conductive panel 34 is pressed against the shielding clip 10 the hump of the contact wing 24 contacts the conductive panel 34 while the tips 25 of the contact wings make electrical contact with the conductive coating 38 along the panel 36. This contact will be in addition to the contact made by the attaching portion 12 of the clip with the panel 36.

Figure 5:
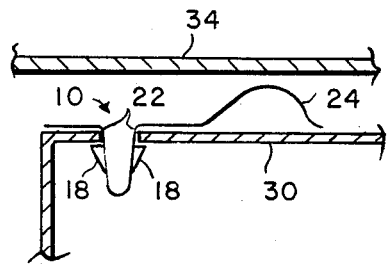
FIG. 5 is an elevational view of an alternate embodiment of the electromagnetic shielding clip of the present invention inserted into panels shown in cross-section.

As shown in FIG. 5, it is not necessary for the shielding clip 10 to have two contact wings 24. The clip 10 shown in FIG. 5 only has a single contact wing 24.

Figure 6:
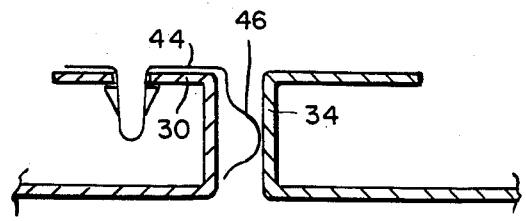
FIG. 6 is an elevational view of a second alternate embodiment of the electromagnetic shielding clip of the present invention inserted in panels shown in cross-section.

Differing panel geometries may require changes in the shapes of the contact wings 24 of the electromagnetic clip 10 of the present invention. As shown in FIG. 6, the second conductive panel 34 is perpendicular to the panel 30 into which the shielding clip is inserted. To handle this arrangement, the contact wing 24 has a planar portion 44 and a humped portion 46 which is perpendicular to the planar portion 44. The humped portion 46 acts as a spring for making contact with the second conductive panel 34.

Figure 7:
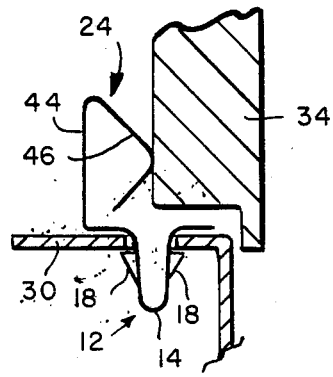
FIG. 7 is an elevational view of a third alternate embodiment of the electromagnetic shielding clip of the present invention inserted in panels shown in cross-section.

In the geometry of FIG. 7, the second conductive panel 34 is perpendicular to the panel 30 into which the clip is inserted but it is located over that clip. The contact wing 24 has been bent so that the humped portion 46 extends over the attaching portion 12. In the embodiment shown in FIG. 7, the humped portion 46 is attached to a planar portion 44. However, it would also be possible to shape the contact wing 24 as a loop.

Figure 8:
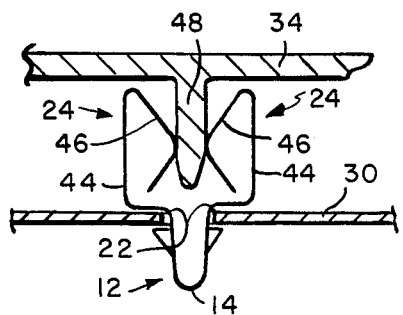
FIG. 8 is an elevational view of a fourth alternate embodiment of the electromagnetic shielding clip of the present invention inserted in panels shown in cross-section.

In FIG. 8, a shielding clip is shown for making contact with a projecting rib 48 from a second conductive panel 34. The panel 34 is parallel to the panel 30 into which the clip is inserted. The clip has two contact wings 24 and each wing has a humped portion 46 which extends over the attaching portion 12 of the clip. The projecting rib 48 is contacted on both sides by the humped portions 46 of the two contact wings.

Figure 9:
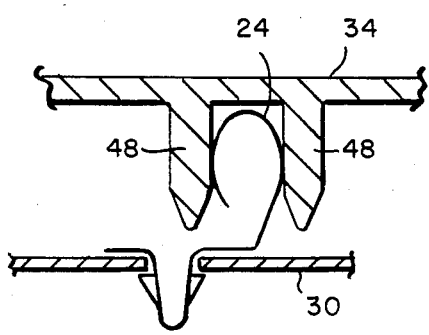
FIG. 9 is an elevational view of a fifth alternate embodiment of the electromagnetic shielding clip of the present invention inserted in panels shown in cross-section.

In the embodiment of FIG. 9, the electromagnetic shielding clip 10 has only a single contact wing which is looped shaped. The looped contact wing 24 is shown fitting within a valley formed between two projecting ribs 48 in a second conductive panel 34. The looped contact wing 24 makes electrical contact with the projecting rib on both sides of the valley.

Figure 10:
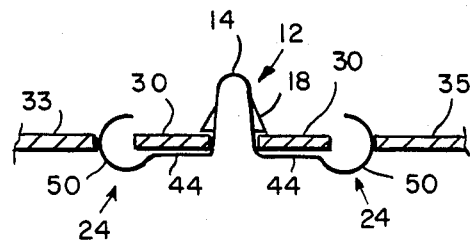
FIG. 10 is an elevational view of a sixth alternate embodiment of the electromagnetic shielding clip of the present invention inserted in panels shown in cross-section.

The clip of FIG. 10 has two contact wings 24. Each wing has a planar portion 44 and a curved portion 50. The curved portion 50 curves towards the bottom 14 of the attaching portion 12. It is preferred that in forming the contact wing 24 of this embodiment that the curved portions 50 be made with a softer spring rate than the planar portions 44. This embodiment is used as shown to provide contact between 3 conductive panels 30, 33, 35 all in a plane.

Figure 11:
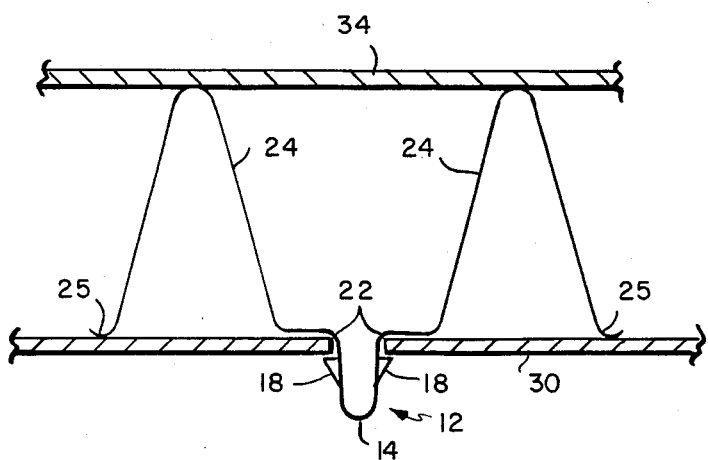
FIG. 11 is an elevational view of a seventh alternate embodiment of the electromagnetic shielding clip of the present invention inserted in panels shown in cross-section.

In the embodiment shown in FIG. 11, an air plenum is formed between the two conductive panels. Thus, it is desirable to provide a shielding contact which does not impede the flow of air through the plenum. The clip of the present invention can be formed with steep humped contact wings. With the steep humped wings it is preferable to have the tips 25 of the contact wings folded back so that the tips will slide along the conductive panel 30. This will avoid irregular bending of the clip when the two panels are brought together into position. The clip is aligned in the air plenum so that air flows through the clip unimpeded. The surface of the metallic strip is perpendicular to the direction of the air flow.

The electromagnetic clip 10 of the present invention can be made of any flexible conductive metal. Copper is presently preferred. Conventional methods may be used to form the clips of the present invention. One suggested process is to begin by shearing the metallic strip to size. Next, the notches 18 are formed using a punch and die. Dies would then be used to form the shape of the shielding clip. It is suggested that first the U-shaped portion be punched by a spring loaded punch and that pivoting dies be used to form the contact wings.

Advantageously, when a clip of the present invention is used, the conductive panel 30 is positively engaged between the sharp edge 20 of the notches 18 and the bent portions 22. The notches 18 are such that they will not bend out of shape in ordinary use and thus maintain the positive engagement with the conductive panels. A single slot or valley is sufficient for providing a place where the shielding clips can be attached.

Of course, it should be understood that various changes and modifications to the preferred embodiments described above will be apparent to those skilled in the art. For example, there are an unlimited number of different ways to shape the contact wings of the clip of the present invention. These and other changes can be made without departing from the spirit and scope of the invention and without diminishing its attendant advantages. It is therefore intended that such changes and modifications be covered by the following claims.

I claim:

1. An electromagnetic shielding clip comprising an elongate metal strip of sheet material of uniform thickness and width, said strip having spaced, parallel sides and ends and embodying midway between its opposite ends a U-shaped deviation comprising an attaching portion embodying a bottom part and upwardly-diverging planar side parts, said strip further embodying at the upper ends of said diverging side parts outwardly-bent planar flange parts on each side of the side parts disposed at right angles to the vertical center line of the diverging side parts, a notch formed in each of the side parts below the flange parts defining a non-deformable ledge in the side parts spaced from and parallel to the flange parts at the upper ends of the side parts, said ledges, in conjunction with the flange parts, defining a clamp for attaching the structure to a panel containing an opening for receiving the attaching portion and a cantilever-supported contact wing constituting an extension of one of the flange parts extending from the distal end of said one of the flange portions.

2. An electromagnetic shielding clip according to claim 1 wherein said notches in said side parts define upwardly-facing edges spaced from and parallel to said outwardly-bent flange parts.

3. The electromagnetic shielding clip of claim 1 wherein said contact wing is hump-shaped for use in providing electromagnetic contact between two parallel panels.

4. The electromagnetic shielding clip of claim 1 wherein said contact wing is bent so as to have a hump-shaped portion extending over said attaching portion.

5. The electromagnetic shielding clip of claim 1 wherein said one flange part comprises each of said flange part and each contact wing is bent so as to have a hump-shaped portion extending over said attaching portion, the hump-shaped portions of each contact wing opposing one another so that electromagnetic contact can be made on both sides of a projection.

6. An electromagnetic shielding clip comprising a metallic strip having an attaching portion with a bottom and two sides, each of said two sides have a notch forming a substantially non-deformable ledge, said notch tapering into the side towards said bottom, said metallic strip further having a rectilinear bent portion on each side of said attaching portion and a contact wing extending from at least one of said bent portions, and wherein said contact wing comprises a planar portion and a humped portion perpendicular to said planar portion.

7. An electromagnetic shielding clip comprising a metallic strip having an attaching portion with a bottom and two sides, each of said two sides having a notch forming a substantially non-deformable ledge, said notch tapering into the side toward said bottom, said metallic strip further having a rectilinear bent portion on each side of said attaching portion and a contact wing extending from at least one of said bent portions, and wherein said contact wing comprises a looped portion.

8. An electromagnetic shielding clip comprising a metallic strip having an attaching portion with a bottom and two sides, each of said two sides having a notch forming a substantially non-deformable ledge, said notch tapering into the side toward said bottom, said metallic strip further having a bent portion on each side of said attaching portion and a contact wing extending from each of said bent portions and each of said contact wings includes a planar portion and a curved portion attached to said planar portion, said curved portion being of softer spring than said planar portion.

9. An electromagnetic shielding clip comprising an elongate metal strip of uniform thickness and width having spaced, parallel sides and ends, said strip embodying midway between its opposite ends a U-shaped attaching part embodying a bottom and two sides, each of two sides embodying an outwardly-extending notch, said notch having an upwardly-facing edge, said edge bounding an opening in the side wall facing away from the bottom, said metal strip further embodying a bent portion on each side extending outwardly from the side at an angle thereto and at the distal end of at least one bent portion, a cantilever-supported contact wing of arcuate configuration extending from the distal end thereof.

10. The electromagnetic shielding clip of claim 9 wherein said edges are sharp enough to dig into a plastic wall so as to hold said clip in place.

11. The electromagnetic shielding clip of claim 9 wherein said contact wing is hump-shaped for use in providing electromagnetic contact between two parallel panels.

12. The electromagnetic shielding clip of claim 9 wherein said contact wing is bent so as to have a hump-shaped portion extending over said attaching portion.

13. The electromagnetic shielding clip of claim 9 wherein said at least one bent portions comprises each of said bent portions and each contact wing is bent so as to have a hump-shaped portion extending over said attaching portion, the hump-shaped portions of each contact wing opposing one another so that electromagnetic contact can be made on both sides of a projection.

14. An electromagnetic shielding clip comprising a metallic strip having a U-shaped attaching portion with a bottom and two sides, each of two sides having a notch, said notch having an edge extending out from said side, said edge bounding a hole in said metallic strip and pointing away from said bottom and said notch tapering into said side from said edge, said metallic strip further having a bent portion on each side of said attaching portion and a contact wing extending from at least one of said bent portions and wherein said contact wing comprises a planar portion and a humped portion perpendicular to said planar portion.

15. An electromagnetic shielding clip comprising a metallic strip having a U-shaped attaching portion with a bottom and two sides, each of two sides having a notch, said notch having an edge extending out from said side, said edge bounding a hole in said metallic strip and pointing away from said bottom and said notch tapering into said side from said edge, said metallic strip further having a bent portion on each side of said attaching portion and a contact wing extending from at least one of said bent portions, and wherein said contact wing comprises a looped portion.

16. An electromagnetic shielding clip comprising a metallic strip having a U-shaped attaching portion with a bottom and two sides, each of two sides having a notch, said notch having an edge extending outwardly from said sides, said edge bounding a hole in said metallic strip and pointing away from said bottom and said notch tapering into said side from said edge, said metallic strip further having a bent portion on each side of said attaching portion and a contact wing extending from each of said bent portions and each of said contact wings includes a planar portion and a curved portion attaching to the planar portion, said curved portion being of softer spring than said planar portion.

17. An electromagnetic shield comprising a first conductive panel having an opening, a metallic strip having an attaching portion with a bottom and two sides, each of said two sides having a notch forming a substantially non-deformable ledge, said notch comprising a portion displaced outwardly from the side, said metallic strip further having a bent portion on each side of said attaching portion spaced from said ledge defining in conjunction with said ledge an anchoring edge for retaining the strip in place and a contact wing extending from at least one of said bent portions, said attaching portion being inserted into the opening in said first conductive panel so that said strip is held onto said panel between said bent portions and said ledges.

18. The electromagnetic shield of claim 17 further comprising a second conductive panel parallel to said first conductive panel and said contact wing having a hump-shaped portion for making electrical contact with said second conductive panel.

19. The electromagnetic shield of claim 18 wherein an air plenum is formed between said first and second conductive panels and air flow is unimpeded by said hump-shaped portion.

20. The electromagnetic shield of claim 17 further comprising a second conductive panel perpendicular to said first conductive panel and said contact wing having a planar portion and a hump-shaped portion perpendicular to said planar portion for making electrical contact with said second conductive panel.

21. The electromagnetic shield of claim 17 further comprising a second conductive panel perpendicular to said first conductive panel and said contact wing being bent so as to have a hump-shaped portion extending over said attaching portion, said hump-shaped portion making electrical contact with said second conductive panel.

22. The electromagnetic shield of claim 17 further comprising a second conductive panel parallel to said first conductive panel and having a projection and said at least one bent portions including each of said bent portions and each contact wing being bent so as to have a hump-shaped portion extending over said attaching portion, the hump-shaped portions of each contact wing opposing one another so that electromagnetic contact can be made on both sides of said projection.

23. The electromagnetic shield of claim 17 wherein said contact wing comprises a looped portion and further comprising a second conductive panel parallel to said first conductive panel and having two ribs forming a valley into which said looped portion is inserted to make electrical contact with each of said ribs.

24. The electromagnetic shield of claim 17 wherein said at least one bent portion comprises each of said bent portions and each of said contact wings includes a planar portion and a curved portion attached to the planar portion, said curved portion being a softer spring than said planar portion, and further comprising second and third conductive panels in a plane with said first conductive panel, each of said curved portions making electrical contact with one of said second and third conductive panels.

25. An electromagnetic shield comprising:
a plastic panel having two projections forming a valley:
a conductive coating on said plastic panel; and
a metallic strip having a U-shaped attaching portion with a bottom and two sides, each of said two sides having a notch, said notch having an edge extending out from said side, said edge boardering a hole in said metallic strip and pointing away from said bottom and said notch tapering into said side from said edge, said metallic strip further having a bent portion on each side of said attaching portion and a contact wing extending from at least one of said bent portions,
said attaching portion of said metallic strip being inserted in said valley and said edges digging into said projections to hold said strip in place on said plastic panel.

26. The electromagnetic shield of claim 25 further comprising a second conductive panel parallel to said plastic panel and wherein said contact wing has a humped portion and a tip so that the humped portion makes electrical contact with said second conductive panel and the tip makes electrical contact with said conductive coating.

27. An electromagnetic shielding clip comprising a flexible sheet metal contact strip of non-rectilinear configuration disposed between two spaced-apart conductor plates such as to make non-coupling contact with each of said spaced-apart conductor plates, said strip having spaced, parallel edges and ends and being of uniform thickness, and anchoring means for detachably attaching one end of the contact strip to one of the conductor plates in a position such that a portion of the contact strip remote from said one end contacts the other conductor plate, comprising an opening in said one of said conductor plates, a rectilinear extension connected at one end to said one end of the contact strip engageable with one side of said one of said conductor plates, a wedge-shaped portion attached to the other end of said rectilinear extension at right angles to said extension engageable within said opening in said one conductor plate and an outwardly-projecting notch at the outer side of the wedge-shaped portion defining a non-deformable retaining ledge spaced from and parallel to said rectilinear extension engageable with the other side of said one of said conductor plates and cooperable with said rectilinear extension to anchor said one end of the contact strip to the conductor plate with said portion of the contact strip remote from the one end in engagement with said other conductor plate.

28. An electromagnetic shielding clip comprising an elongate metal strip having spaced, parallel sides and ends embodying an arcuate portion and at one end thereof a rectilinear portion, a wedge-shaped portion connected to the rectilinear portion disposed at right angles to said rectilinear portion and extending from the rectilinear portion in a direction away from the arcuate portion and a notch in a side of the wedge-shaped portion extending outwardly therefrom, said notch defining an edge spaced from and parallel to the rectilinear portion and disposed transversely with respect to said rectilinear portion.

* * * * *